United States Patent [19]
Daoud

[11] Patent Number: 5,740,685
[45] Date of Patent: Apr. 21, 1998

[54] SECURITY MECHANISM FOR A NETWORK INTERFACE UNIT

[75] Inventor: Bassel Hage Daoud, Parsippany, N.J.

[73] Assignee: Lucent Technologies, Inc., Murray Hill, N.J.

[21] Appl. No.: 700,602

[22] Filed: Aug. 13, 1996

[51] Int. Cl.⁶ .................................................. B65D 55/14
[52] U.S. Cl. .................... 70/164; 70/232; 70/DIG. 57; 292/307 R
[58] Field of Search ............... 292/307 R; 70/DIG. 57, 70/229, 232, 164, 163, 58, 166

[56] References Cited

U.S. PATENT DOCUMENTS

| | | | |
|---|---|---|---|
| 2,800,601 | 7/1957 | Martin et al. | 70/232 |
| 3,211,408 | 10/1965 | Schaefer | 70/58 X |
| 3,572,795 | 3/1971 | Howard et al. | 292/307 R |
| 3,910,079 | 10/1975 | Gassaway | 70/58 |
| 4,438,642 | 3/1984 | De Jong | 70/DIG. 57 X |
| 4,444,031 | 4/1984 | Watson | 70/DIG. 57 X |
| 4,724,689 | 2/1988 | Anchia | 70/58 |
| 4,736,603 | 4/1988 | Brushaber | 70/232 |
| 5,010,748 | 4/1991 | Derman | 70/164 |
| 5,027,627 | 7/1991 | Derman | 70/DIG. 57 X |
| 5,447,045 | 9/1995 | Cheng | 70/DIG. 57 X |

Primary Examiner—Rodney M. Lindsey

[57] ABSTRACT

Disclosed is a security mechanism for electronics enclosures such as network interface units which permits access by customers and craftspersons. A bracket is mounted to the cover of the enclosure. The bracket includes two apertures, one for receiving a security screw, and the other for receiving an ordinary screw which fastens the cover to the enclosure. The bracket also includes a cavity which accommodates the shackle of a padlock so that the ordinary screw can be covered and access prevented. Craftspersons can override the padlock by loosening the security screw and moving the bracket until the padlock is removed from the cavity.

9 Claims, 3 Drawing Sheets

5,740,685

SECURITY MECHANISM FOR A NETWORK INTERFACE UNIT

FIELD OF THE INVENTION

This invention relates to a security mechanism which is especially suited for network interface units.

BACKGROUND OF THE INVENTION

Network interface units constitute the demarcation between the customer's equipment and a telecommunications network. In buildings including multiple subscribers, the interface unit is typically mounted in a basement and includes an array of customer bridges, each bridge being coupled to an individual subscriber's line. The bridges are coupled to the network through an RJ11 jack and plug so that the customer can plug a working phone into the jack to determine if any problem lies in the customer or network side of the telecommunications system. Network interface units also typically include a building entrance protector portion which comprises a cable splice chamber and a protector field for providing surge protection for each customer. (For an example of a network interface unit, see U.S. Pat. No. 5,363,440 issued to Daoud).

It is desirable to prevent unauthorized access to the unit, otherwise improper use might be made of the network. Typically, some mechanism is provided for each individual to padlock his or her individual bridge while permitting the network provider's craftsperson to override the mechanism and gain access to the customer bridges and protector portion. (See, e.g., U.S. Pat. No. 5,370,547 issued to Daoud.) While effective, such security mechanisms require a fair amount of space which prevents a desirable reduction in size of the unit.

SUMMARY OF THE INVENTION

The invention is a security apparatus comprising a cover for an electronics enclosure, the cover including a first aperture for receiving a first fastener and a second aperture for receiving a second fastener. The apparatus further includes a bracket mounted to the cover, the bracket including a first portion defining a third aperture aligned with the first aperture and a second portion defining a fourth aperture aligned with the second aperture. The second portion also includes a cavity which accommodates a shackle of a padlock placed over the second fastener. The third aperture is positioned so that the bracket may be moved when the first fastener is loosened and the shackle removed from the cavity.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
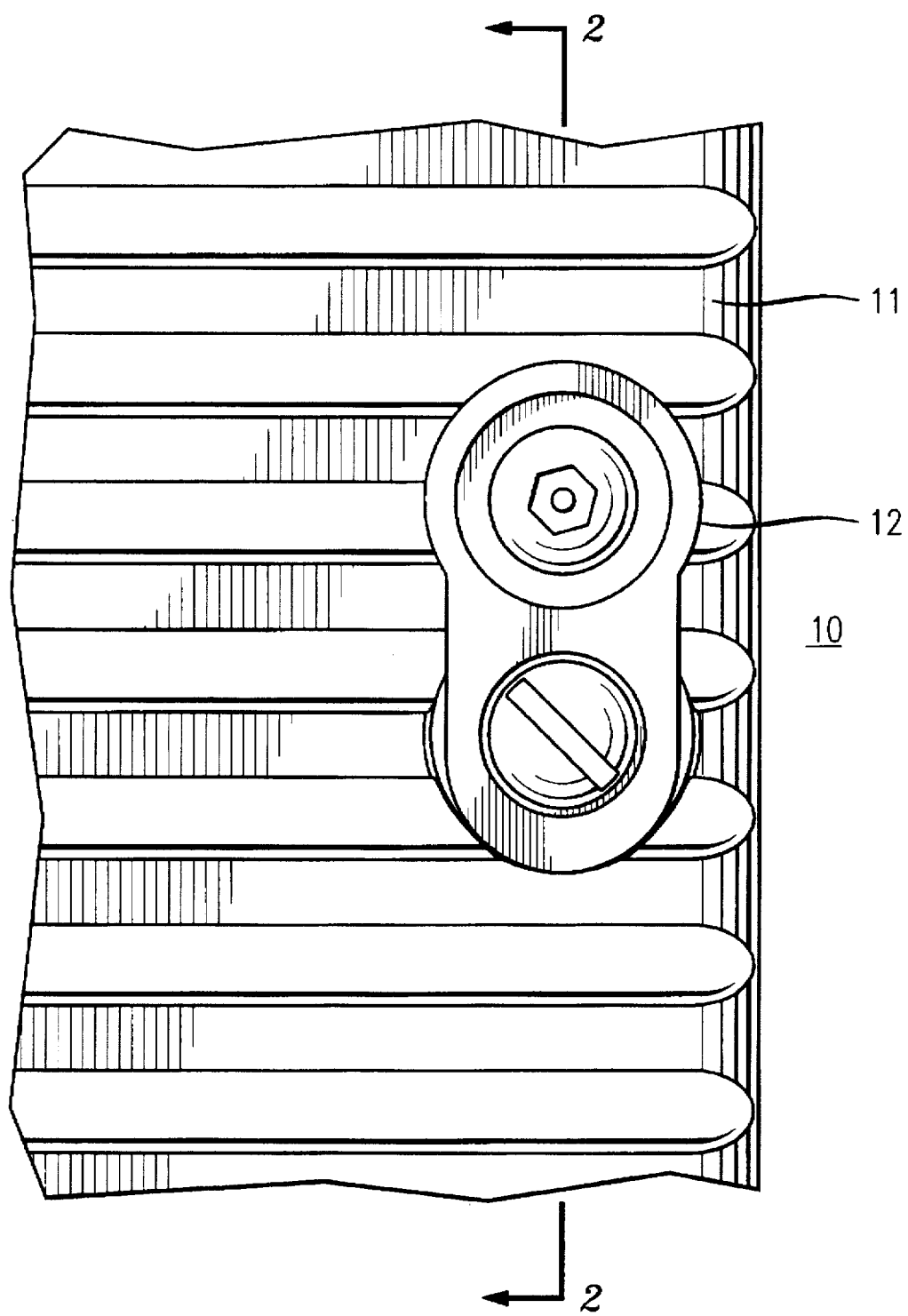
FIG. 1 is a plan view of a door for a network interface unit which includes the security apparatus in accordance with an embodiment of the invention.
Figure 2:
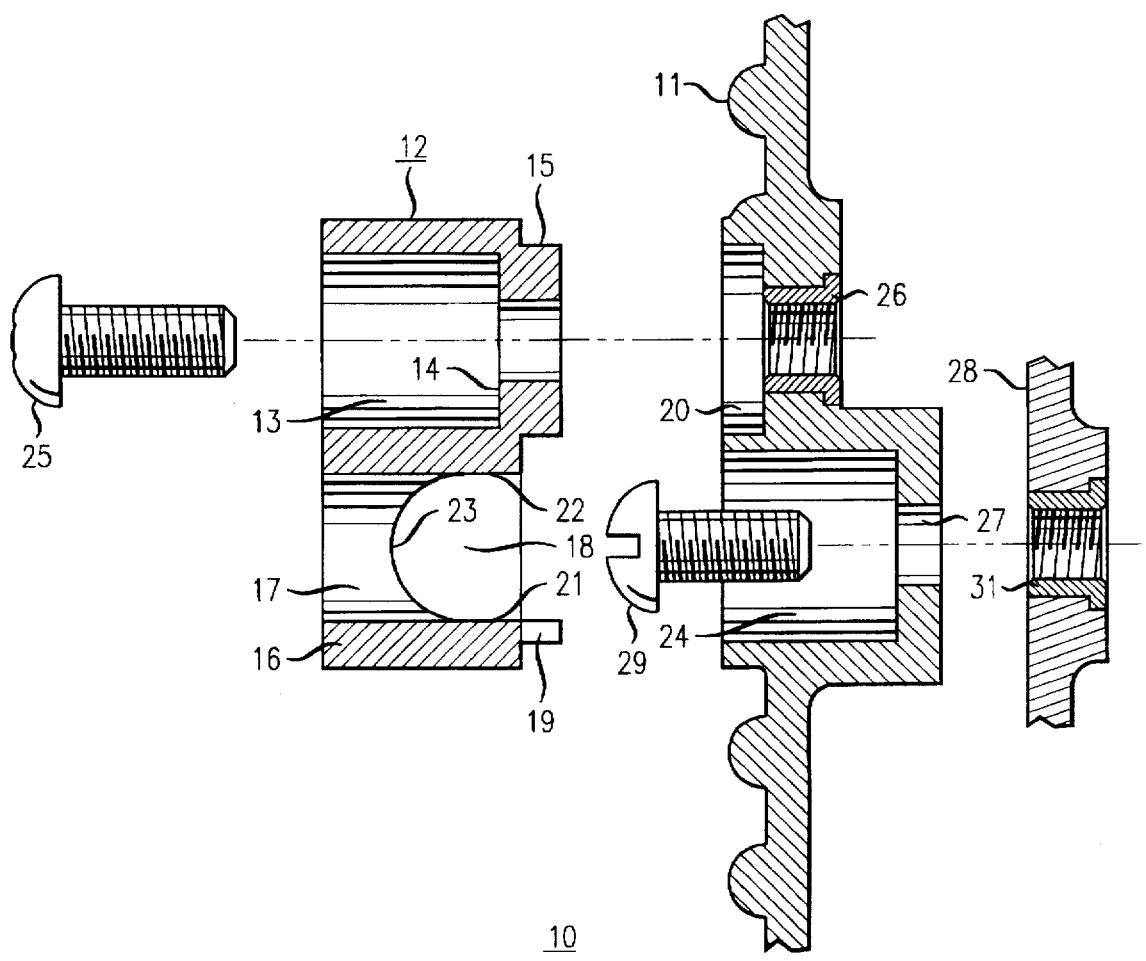
FIG. 2 is a cross sectional, exploded view taken along line 2—2 of FIG. 1.

Referring now to the drawings, in which like reference numerals identify similar or identical elements, FIG. 1 illustrates the security apparatus in a plan view, while FIG. 2 shows a cross sectional view along line 2—2. The apparatus includes a bracket, 10, which is mounted to a cover, 11. Preferably, the cover, 11, is mounted on a network interface unit, but the security apparatus may be used on covers for other types of electronic enclosures. The bracket would typically be made of a single molded plastic.

The bracket, 10, includes a first portion, 12, which defines a first aperture, 13, having a relatively wide portion at the top of the bracket and a relatively narrow portion at the bottom of the bracket. The aperture, 13, in this example is cylindrical, with the wide portion having a diameter of 14 mm. and the narrow portion having a diameter of 10 mm. The boundary between the wide and narrow portions defines a shoulder, 14. The bottom of the portion, 12, which defines the narrow portion of the aperture is itself formed into a narrowed cylindrical portion, 15, which fits within a recess, 20, in the cover, 11.

Figure 3:
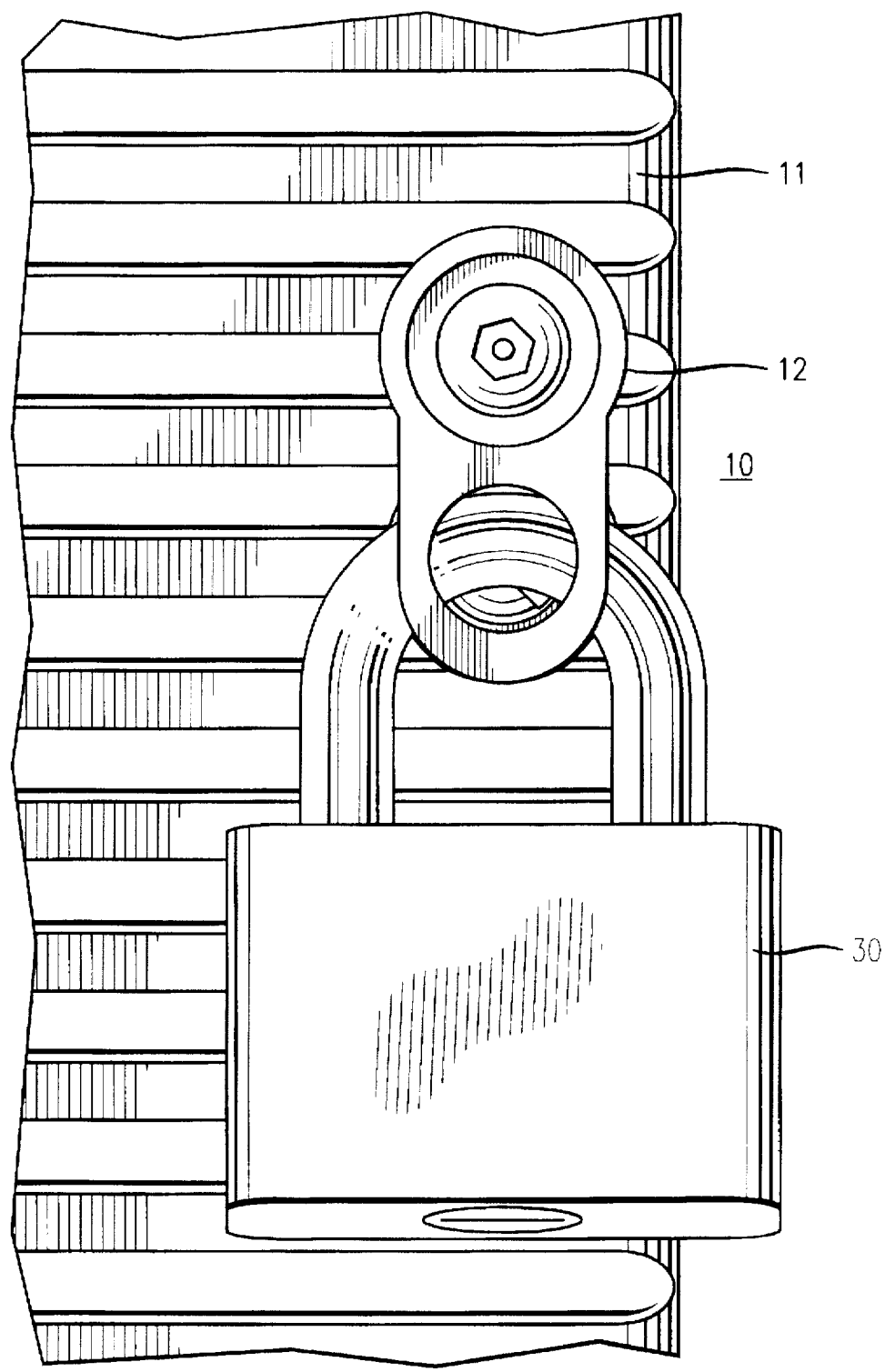
FIG. 3 is a plan view of the security apparatus of FIG. 1 including a padlock.

The bracket, 10, further includes a second portion, 16, which defines a second aperture, 17. The aperture, 17, is also cylindrical in this example, and typically has a diameter of 14 mm. The second portion also defines a cavity, 18, below the aperture, 17. The cavity, which is defined by two side walls, 21 and 22, and a curved roof, 23, is sized to receive the shackle of a padlock, 30 of FIG. 3. The bottom of the second portion, 16, also includes a tab, 19, which extends into an aperture, 24, in the cover, 11, when the cylindrical portion, 15, is inserted into the aperture, 20. The tab, 19, stops the bracket from rotating once inserted into the apertures, 20 and 24.

Once the bracket is inserted into the cover, a fastener, such as a standard security screw, 25, is inserted through the aperture, 13, and threaded into a threaded insert, 26, which is mounted in the cover, 11, below the aperture, 20, and aligned with the aperture, 13. As known in the art, a security screw requires a special tool, usually available only to authorized craftspeople, in order to fasten and unfasten. Another fastener, in this example, a standard slotted screw, 29, is inserted through the aperture, 17, the cavity, 18, the aperture 24, and another aperture, 27, at the bottom of aperture, 24, so that the screw is received by another threaded insert, 31, mounted in the frame, 28, of the network interface unit.

Thus, in normal operation, anyone can open the cover, 11, and gain access to the network interface unit, by simply inserting a screwdriver through aperture 17, and unscrewing the screw, 29. If, however, the owner of the building wants to prevent unauthorized access, he or she can provide a padlock, 30, with its shackle in the cavity, 18, thereby covering the slotted screw, 29. If a craftsperson wants to gain access in spite of the presence of the padlock, he or she can unscrew the security screw, 25, with the special tool and either completely remove the bracket, 10, or raise it up to the position where tab, 19, clears the aperture, 24, so that the bracket can be rotated in this example in a counter-clockwise direction. In either case, the padlock can then be removed without unlocking it, and the craftsperson then has access to the slotted screw, 29, to permit entry. When the service is completed, the padlock can be re-inserted in the cavity, 18, and the bracket secured to the cover by tightening the security screw, 25.

The invention claimed is:

1. A security apparatus comprising:

a first fastener;

a second fastener;

a cover for an electronics enclosure, the cover including a first aperture for receiving the first fastener and a second aperture for receiving the second fastener; and a bracket mounted on the cover, said bracket including a first portion defining a third aperture aligned with the first aperture and a second portion defining a fourth aperture aligned with the second aperture, the second portion also defining a cavity which accommodates a shackle of a padlock placed over the second fastener, at least the fourth aperture being structurally defined so that the second fastener can be accessed when the first fastener is at least partially removed, independent of whether the shackle is removed from the cavity.

2. The apparatus according to claim 1 wherein the first fastener comprises a security screw and the second fastener comprises a slotted screw.

3. The apparatus according to claim 1 wherein the cover includes a threaded insert in the first aperture for receiving the first fastener.

4. The apparatus according to claim 1 wherein the cover includes a first recess for receiving the first portion of the bracket.

5. The apparatus according to claim 4 wherein the cover includes a second recess for receiving the second portion of the bracket.

6. The apparatus according to claim 5 wherein the second portion includes a tab on a bottom surface of the second portion for preventing rotation of the bracket while the second portion is within the second recess.

7. The apparatus according to claim 1 wherein the third aperture comprises a relatively wide portion and a relatively narrow portion defining a shoulder therebetween against which a head of the first fastener rests when the first fastener is fully inserted in the first aperture.

8. The apparatus according to claim 1 wherein the cavity is defined by two side walls and a roof which also define a bottom portion of the fourth aperture.

9. The apparatus according to claim 4, wherein the first portion of the bracket is a cylindrical portion which is positioned within the recess when the security apparatus is in a locked position.

* * * * *